(12) United States Patent
Kinoshita

(10) Patent No.: US 6,587,619 B1
(45) Date of Patent: Jul. 1, 2003

(54) OPTICAL FUNCTIONAL DEVICES THEIR MANUFACTURING METHOD AND OPTICAL COMMUNICATION SYSTEM

(75) Inventor: Junichi Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/366,667

(22) Filed: Aug. 3, 1999

(30) Foreign Application Priority Data

Aug. 4, 1998 (JP) .......................................... 10-220373

(51) Int. Cl.$^7$ ................................................ G02B 6/34
(52) U.S. Cl. ...................................................... 385/37
(58) Field of Search .............................. 385/37; 372/7, 372/26, 45, 50, 96, 102, 6

(56) References Cited

U.S. PATENT DOCUMENTS

| | | | | |
|---|---|---|---|---|
| 4,958,357 A | * | 9/1990 | Kinoshita | 372/96 |
| 5,701,325 A | * | 12/1997 | Ouchi et al. | 372/96 |
| 6,081,636 A | * | 6/2000 | Kinoshita | 385/24 |
| 6,091,745 A | * | 7/2000 | Nitta | 372/27 |

* cited by examiner

Primary Examiner—Frank G. Font
Assistant Examiner—Michael P. Mooney
(74) Attorney, Agent, or Firm—Hogan & Hartson, LLP

(57) ABSTRACT

In order to realize an optical functional device like a DFB laser in which the radiation mode loss is small and the threshold current is low even when high-order gratings easy to process are used, the gratings are configured to be asymmetric in its cross-sectional structure. Then, by partly varying the asymmetry (blaze angle) of the cross-sectional structure of the gratings along the cavity lengthwise direction, the cavity-lengthwise profile of radiation modes from the high-order gratings is controlled. It is also controlled by using a relationship between a phase shift of the gratings and the asymmetry. In a edge emitting DFB laser, by utilizing destructive interference among radiation modes, the radiation mode loss is reduced, and the threshold can be decreased. When a radiation mode is used as an output, the radiation mode can be reinforced to increase the output by utilizing constructive interference.

18 Claims, 12 Drawing Sheets

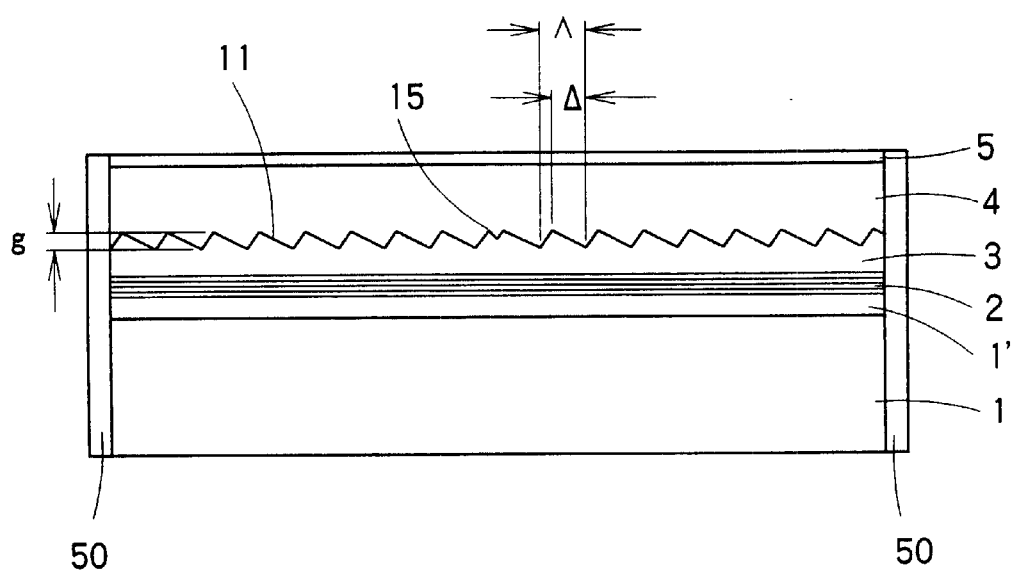
F I G. 1

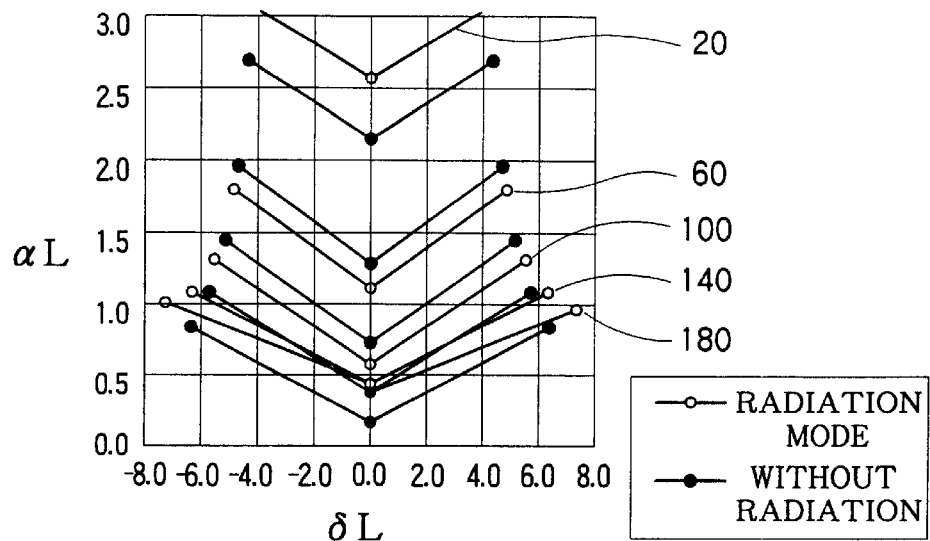
F I G. 2
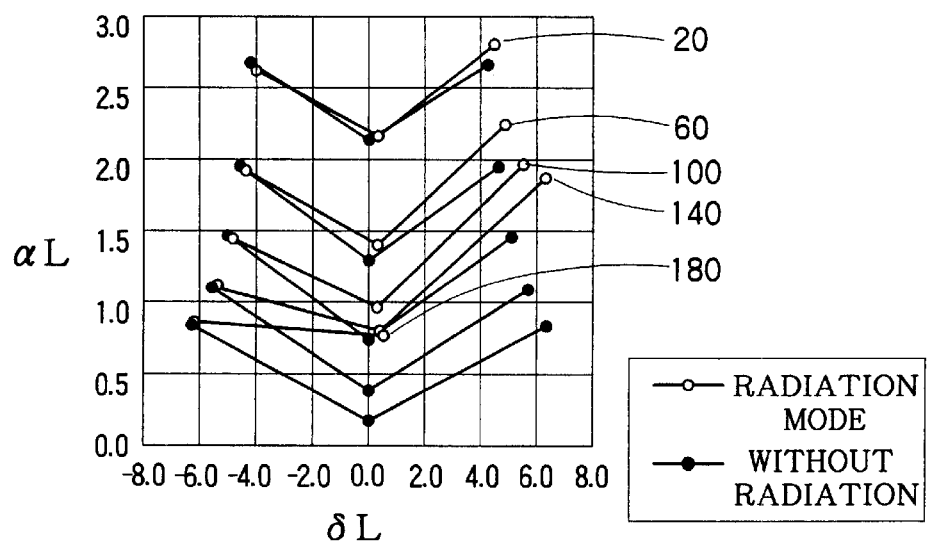
F I G. 3

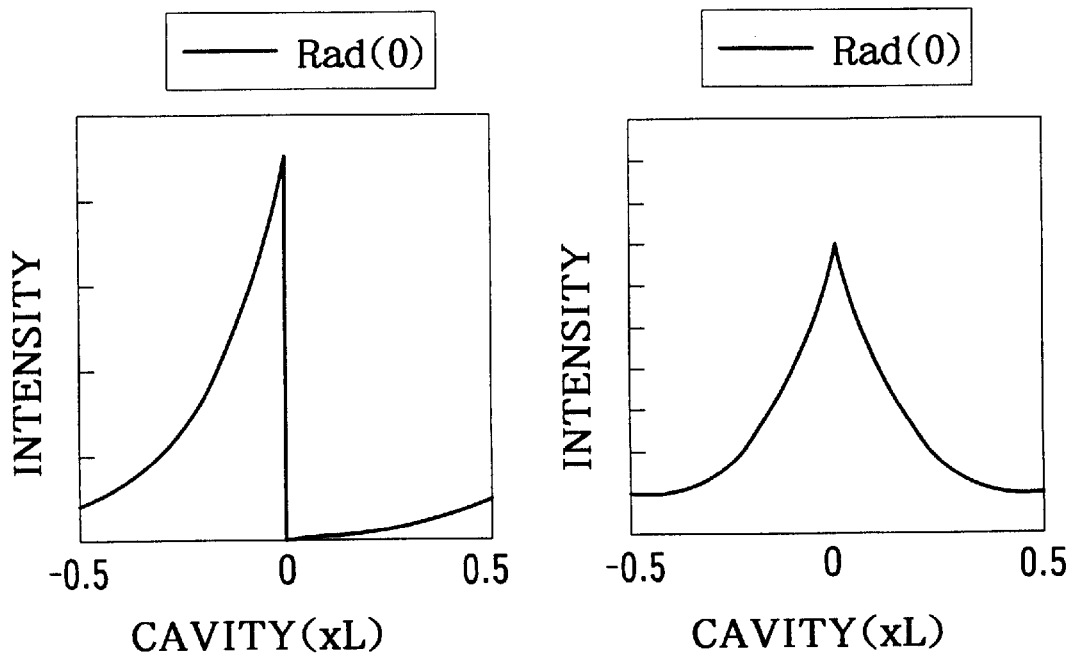
F I G. 4A      F I G. 4B
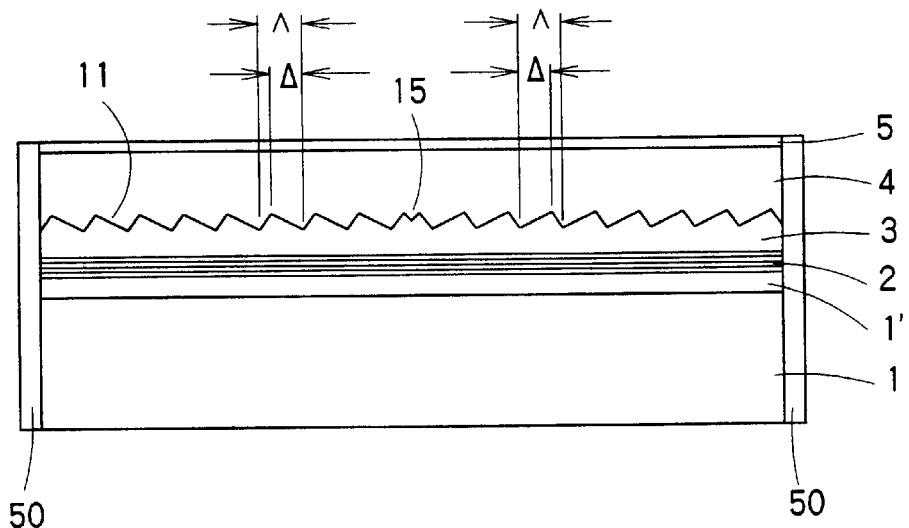
F I G. 5

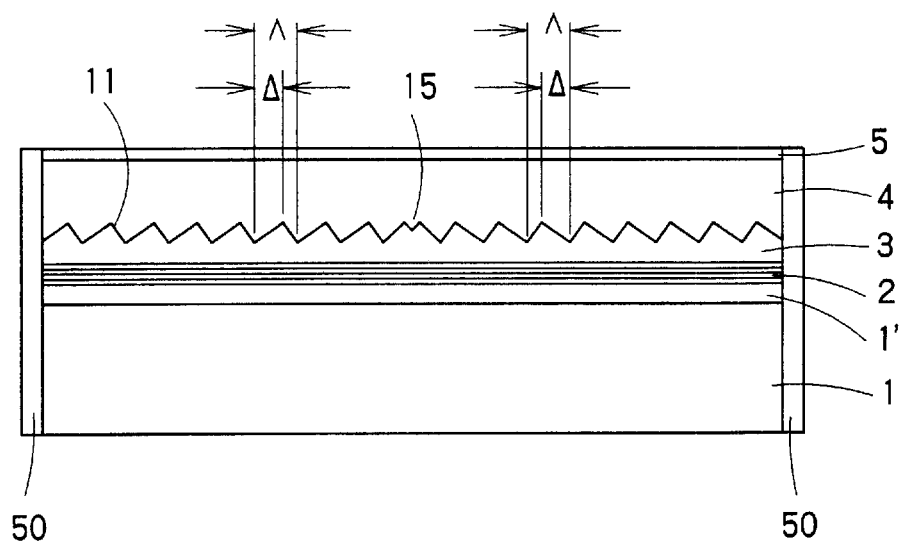
F I G. 8
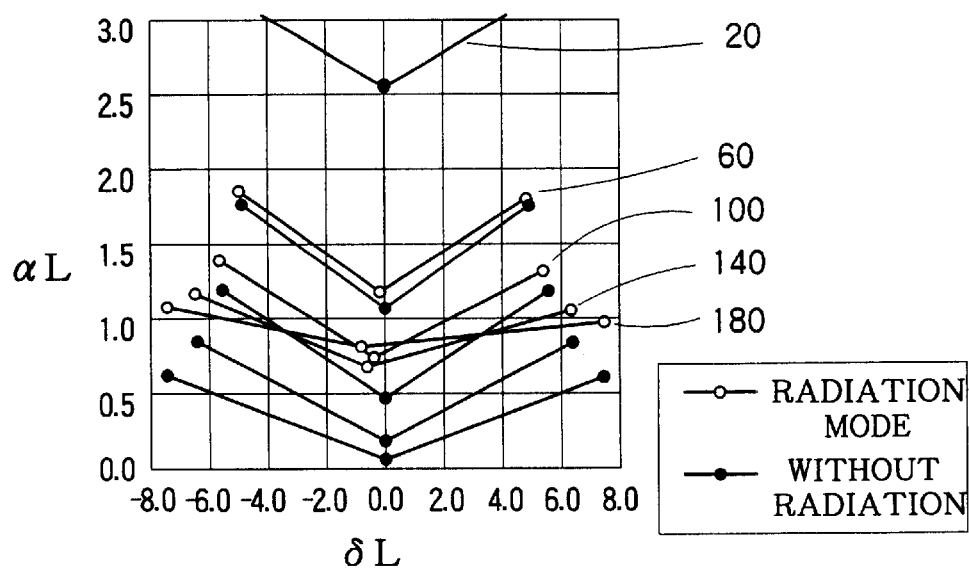
F I G. 9

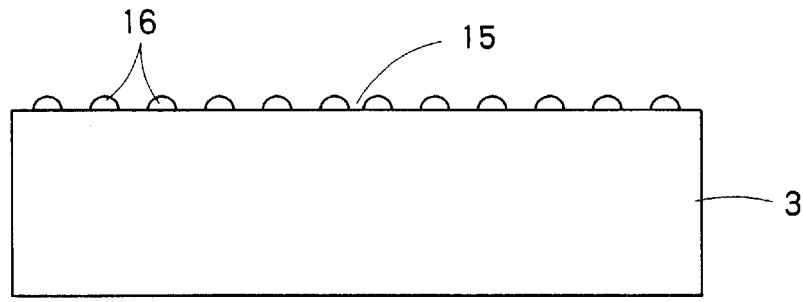
F I G. 13A
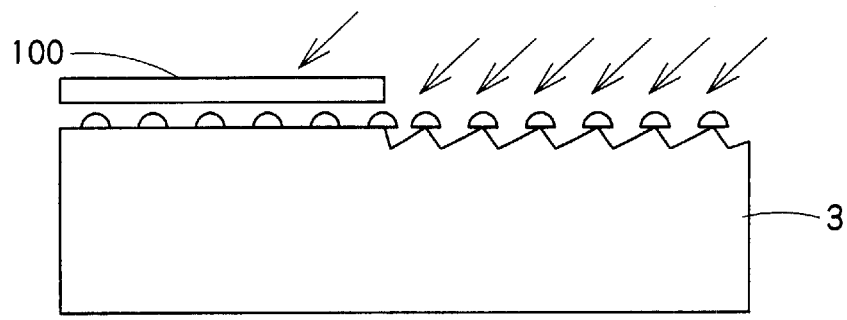
F I G. 13B
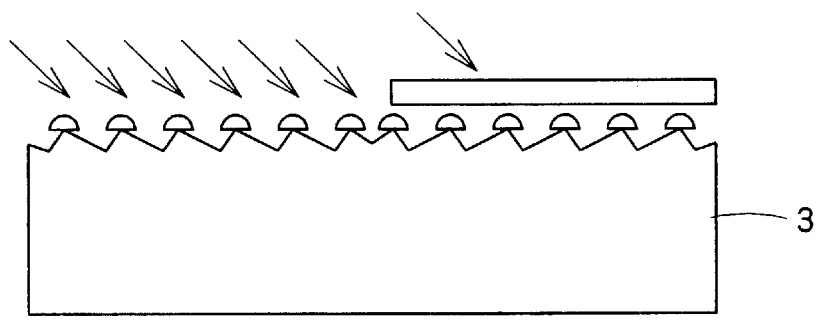
F I G. 13C
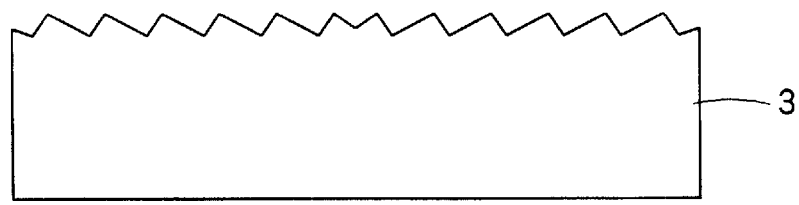
F I G. 13D

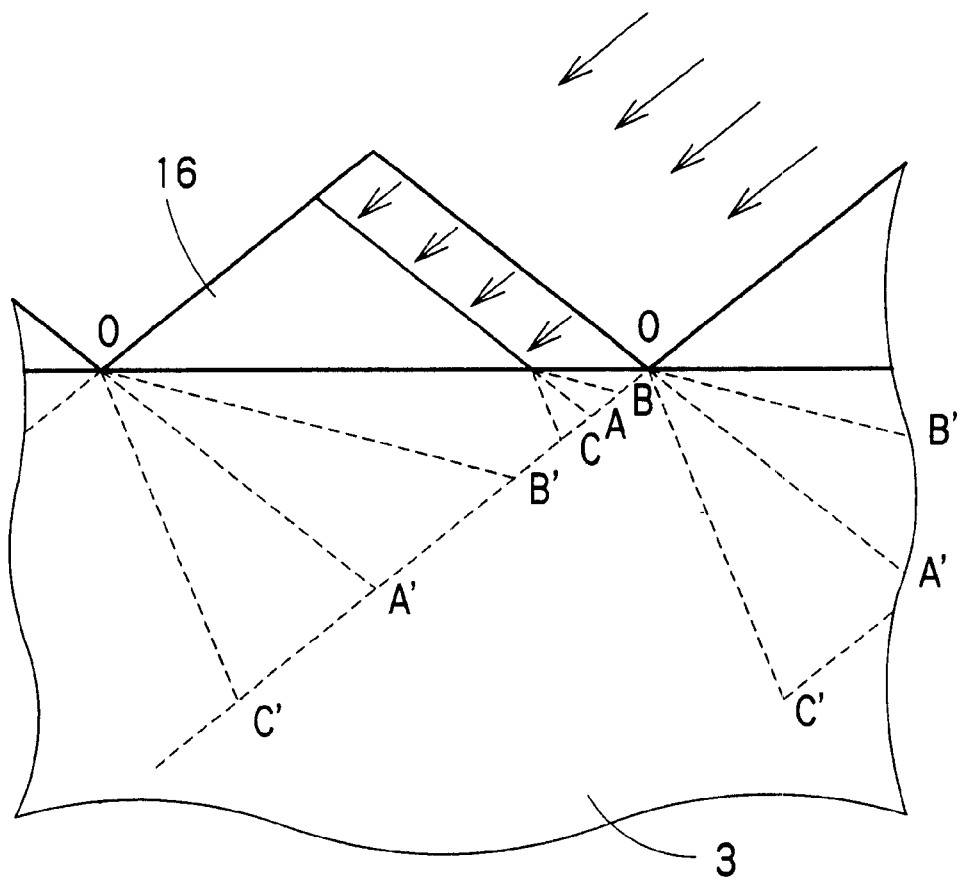
F I G. 15

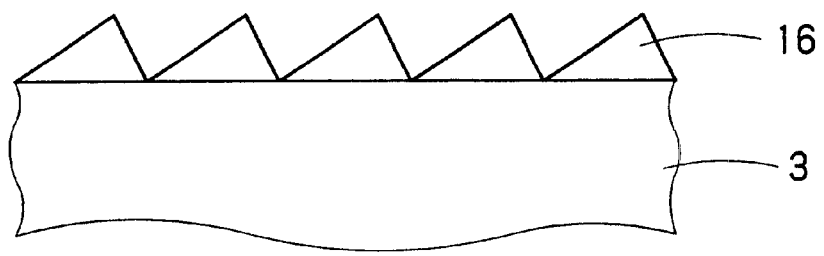
F I G. 16A
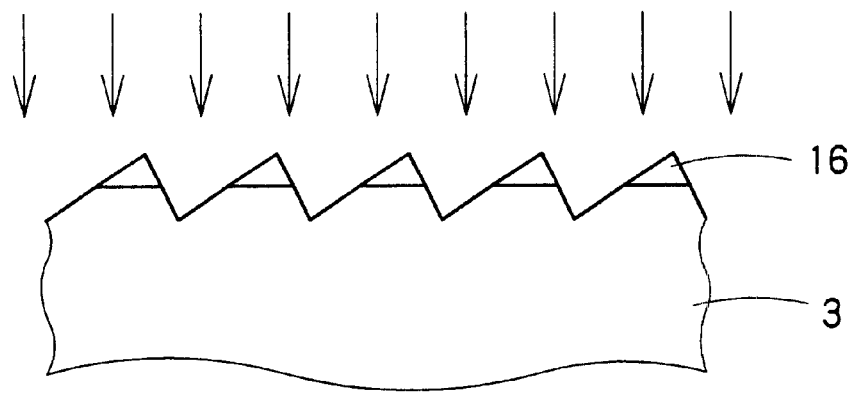
F I G. 16B
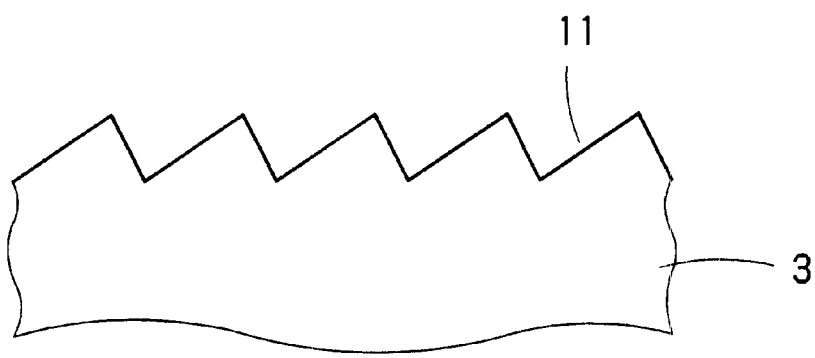
F I G. 16C

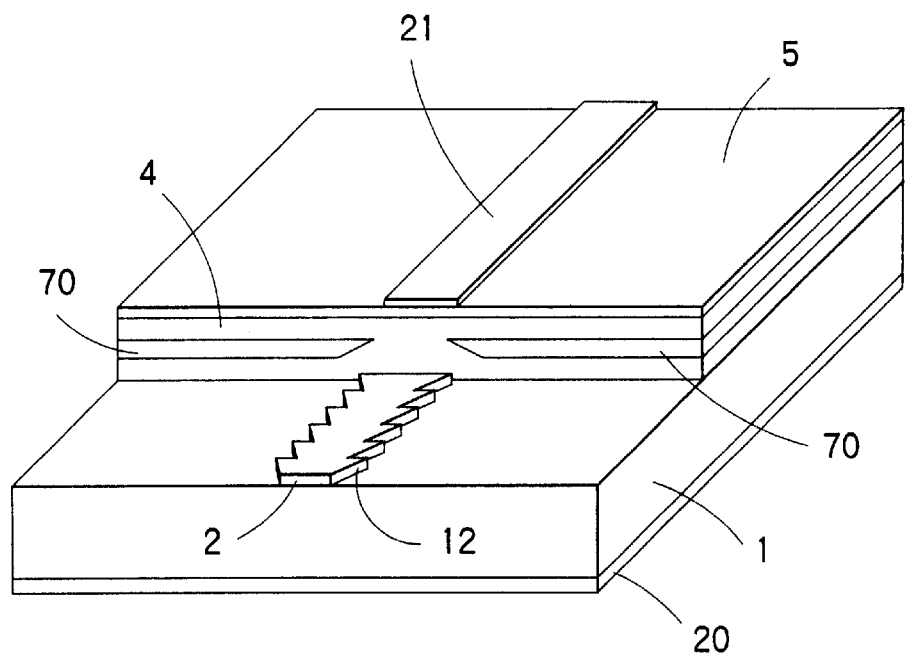
F I G. 17
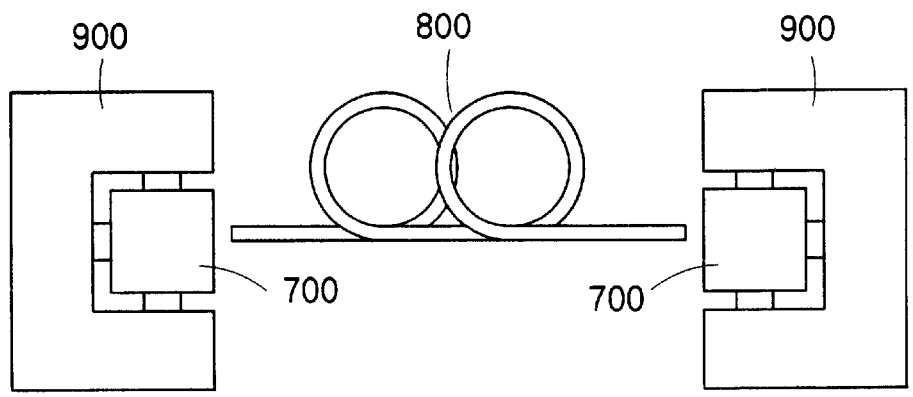
F I G. 18

OPTICAL FUNCTIONAL DEVICES THEIR MANUFACTURING METHOD AND OPTICAL COMMUNICATION SYSTEM

BACKGROUND OF THE INVENTION

This invention relates to optical functional devices, their manufacturing method and an optical communication system. More specifically, the invention relates to optical functional devices including distributed feedback (DFB) lasers with an optical waveguide structure having 2nd- or higher-order gratings, and other various optical functional devices having similar waveguide structures, and their manufacturing methods. The invention also relates to an optical communication system using these devices.

DFB lasers are often used in optical communication because single longitudinal mode oscillation is easily obtained. Single longitudinal mode oscillation is realized by a periodic structure formed along the waveguide of a laser, that is, diffraction gratings, because optical feedback for resonance becomes greatest in a specific longitudinal mode determined by the period of the gratings.

In optical communication using silica fibers, both the 1300 nm wavelength band and the 1550 nm wavelength band are used because these wavelength bands correspond to low-loss, low-dispersion regions of silica fibers. The InGaAsP/InP material system are most suitable for fabricating light emitting devices which emit in these bands. Therefore, InGaAsP/InP DFB lasers are widely used for optical communication.

FIG. 19 is a longitudinal cross-sectional view showing a structure of a conventional InGaAsP/InP-DFB laser. That is, FIG. 19 shows a cross-sectional view taken along a plane parallel to the waveguide of the DFB laser. This laser has sing 1st-order Bragg gratings with a $\lambda/4$ phase shift. The structure of the laser shown here is explained below, following to its manufacturing procedures.

First made on an n-type InP substrate 101 is an n-type InP buffer layer 101' by crystal growth. Next grown thereon are an active layer 102 having a multi-layered structure of InGaAsP quantum well layers and barrier layers, and a waveguide layer 103 having a lower refractive index than that of the active layer 102. After these steps of growth, the wafer is taken out from the growth furnace.

After that, 1st-order gratings 110 are grooved on the waveguide layer 103. In this process, a phase shift 115 by ¼ or −¼ of the wavelength $\lambda$ in the waveguide, is simultaneously made at a central position of the cavity. The same effect is also obtained by using a structure changing the effective refractive index of the waveguide instead of the actual phase shift. That is, even when the period of the gratings 110 is uniform, a region (not shown) where the waveguide structure changes in width, thickness or refractive index effectively functions as a phase shift.

After that, while keeping the configuration of the gratings 110 and the phase shift 115, a p-type InP cladding layer 104 and InGaAs contact layer 105 are stacked on them by crystal growth.

Thereafter, a stripe structure (not shown) is made to extend in parallel to the wafer surface. Typical stripe structures are BH structure (buried heterostructure) and RWG (ridge waveguide) structure.

After that, a p-side electrode is formed on the p-type contact layer 105, and an n-side electrode is formed on the bottom surface of the n-type substrate 101 (both not shown).

In the phase shift structure, the probability of the single longitudinal mode operation decreases if the reflectivity of both edges exceeds 1%. Therefore, both edges are coated by AR (anti-reflection) coating 150. This can be realized by depositing dielectric thin films on the edges by the thickness of $\lambda/4$ ($\lambda$: oscillation wavelength).

Other than the structure shown in FIG. 19, there is a HR/AR (high reflectivity/anti-reflection) structure. A cross-sectional configuration of a laser having this structure is shown in FIG. 20. A difference from FIG. 19 lies in having no phase shift 115 but having a HR coat 160 with the reflectivity greater than 90% on one of the edges. The HR coat 160 is a dielectric multi-layered film. It is discerned here that the relative phase between the HR coat edge and the gratings corresponds to the phase shift of FIG. 190, if it is folded back about the position of the HR coat 160 as the center of a mirror image. Usually, the phase of the gratings at the edge cannot be controlled. Therefore, the probability of obtaining preferable facet phases becomes lower. Taking account of it, the yield of the single longitudinal mode in the structure of FIG. 20 is inferior to that of the $\lambda/4$ for $\pi/2$ shift structure of FIG. 19. Nevertheless, because of a large optical output from the AR edge, it is still useful as a high-output or high-efficiency structure.

These conventional DFB lasers, however, involved the problem that they were difficult to manufacture and often difficult to realize acceptable properties.

More specifically, the period of the gratings of a DFB laser utilizing 1st-order Bragg diffraction has to be approximately 200 nm to realize the wavelength of 1300 nm and approximately 240 nm to realize the wavelength of 1550 nm. When making the gratings, patterning must be as small as half the period, and an ultimate nano-process technique is required. Therefore, it is not easy to realize such gratings.

On the other hand, coupling efficiency $\kappa$, which strongly affects the performance DFB laser, depends on the shape of the gratings. If the coupling efficiency $\kappa$ is excessively small, sufficient distribution feedback is not obtained, and the laser becomes difficult to oscillate in a single longitudinal mode. If it is excessively large, the threshold current of other longitudinal modes also become lower, and spatial hole burning phenomenon caused by longitudinal non uniformity of optical power makes single longitudinal mode operation unstable. That is, the coupling efficiency $\kappa$ must be within an optimum range. (Since the property of a DFB laser depends on its cavity length L as well, it is usually evaluated in terms of kL by multiplying L.) In order to realize an optimum value of $\kappa$, the gratings must be precisely fabricated in depth and configuration. However, considering that 1st-order gratings are extremely fine as explained above, control of their configuration is very difficult. Additionally, optimum depth of 1st-order gratings is as very shallow as 20 to 30 nm approximately, its control is also difficult. As a result, there has been the problem that an optimum $\kappa$ value cannot be realized, and lasers satisfying desired properties cannot be obtained easily.

However, if utilizing 2nd- or higher-order Bragg gratings, their period is elongated to twice or more than 1st-order gratings, and the size of their patterning is enlarged sufficiently to make their fabrication easy. Additionally, depth of the gratings for obtaining the same value of $\kappa$ increases as well, and this makes it easy to control $\kappa$.

However, the use of 2nd- or higher-order gratings introduces lower-order diffraction light as radiation modes emitted from the waveguide. This is a loss for the DFB laser. This increases the threshold currents and deteriorates single longitudinal mode capability.

SUMMARY OF THE INVENTION

The present invention has been made from recognition of these issues. It is therefore an object of the invention to provide optical functional devices, such as low-threshold DFB laser, which are decreased in radiation mode loss even when using easily processed high-order gratings. It is a further object of the invention to improve their single longitudinal mode properties higher than those of using 1st-order gratings. It is another object of the invention to provide an optical functional device as surface-emitting laser (GCSEL: grating-coupled surface emitting laser) using 2nd-order gratings which can be optimized in threshold currents and emitted output or in light emitting pattern. Additionally, it is an object of the invention to provide their manufacturing method and an optical communication system using these devices.

According to the invention, there is provided an optical functional device including a waveguide and gratings formed along the waveguide for emitting light at a specific wavelength, comprising: the diffraction gratings causing 2nd- or higher-order Bragg diffraction at the gratings having a unit structure which is asymmetric in the direction along the waveguide, and the gratings having a phase shift.

According to the invention, there is further provided an optical functional device including a waveguide and gratings formed along the waveguide for emitting at a specific wavelength, comprising: the diffraction gratings causing 2nd- or higher-order Bragg diffraction at the gratings having a unit structure which is asymmetric in the direction along the waveguide, and the gratings varying in degree of the asymmetry along the waveguide direction.

According to the invention, there is further provided an optical functional device including a waveguide and gratings formed along the waveguide for emitting light at a specific wavelength, comprising: the diffraction gratings causing 2nd- or higher-order Bragg diffraction, the gratings having a unit structure which is asymmetric in the direction along the waveguide; and the gratings having a first part including unit structures each having a first asymmetry, and a second part including unit structures each having a second asymmetry different from that of the first part.

The gratings may have the first part starting from one end of the waveguide and the second part from the other, the gratings having a phase shift between the first part and the second part.

The first part and the second part may be so configured that net radiation power escaped from the waveguide through the gratings attenuate interactively.

The gratings may include a plurality of protrusions periodically aligned along the waveguide and each forming each unit structure, each protrusion defining a slope facing to the phase shift being gentler than the slope on the far side of the shift, the phase shift of $\{n\lambda \pm (\frac{1}{8} \sim \frac{3}{8})\}\lambda$ where $\lambda$ is the guided wavelength, and n is an arbitrary integer.

Alternatively, the first part and the second part are so configured that radiation mode power escaped from the waveguide through the gratings interactively intensify.

The gratings may include a plurality of protrusions periodically aligned along the waveguide and each forming each unit structure, each protrusion defining a slope facing to the phase shift being steeper than the slope on the far side of the shift, the phase shift of $\{n\lambda \pm (\frac{1}{8} \sim \frac{3}{8})\}\lambda$ is a guided wavelength in the waveguide, and n is an arbitrary integer.

According to the invention, there is further provided an optical functional device including a waveguide and gratings formed along the waveguide for emitting at a specific wavelength, comprising: the diffraction gratings causing 2nd- or higher-order Bragg diffraction, the gratings having a unit structure which is asymmetric in the direction along the waveguide; and the waveguide having a high-reflectivity facet having a high optical reflectivity at one end thereof, and a low-reflectivity facet having a low optical reflectivity at the other end thereof.

The reflectivity of the high-reflectivity facet is preferably not less than 60%, and the reflectivity of the low-reflectivity facet is preferably not higher than 1%.

The gratings and the relative phase at the high reflectively facet may be so configured that radiation mode power escaped from the waveguide therethrough attenuate interactively.

The gratings may include a plurality of protrusions periodically aligned along the waveguide and each forming each unit structure, each protrusion defining a slope facing to the high-reflectivity facet being gentler than a slope on the other side, the relative phase at the high-reflectivity facet being $n\lambda + (3\lambda/4 - \lambda/8 \sim +\lambda/8$ where $\lambda$ is the guided wavelength, and n is an arbitrary integer. That is, here is provided an offset amount in the range from $\frac{1}{8}$ to $\frac{3}{8}$ from arbitrary integer multiplied by the guided wavelength.

Alternatively, the gratings and the relative phase at the high-reflectivity facet may be so configured that radiation mode power escaped from the waveguide therethrough intensify interactively.

The gratings may include a plurality of protrusions periodically aligned along the waveguide and each forming each unit structure, each protrusion defining a slope facing to the high-reflectivity facet being steeper than a slope on the other side, the relative phase at the high-reflectivity facet being $2n\pi + 3\pi/2 - \pi/2 \sim 3/2\pi$ guided, and n is an arbitrary integer. That is, here is provided an offset amount in the range from $\lambda/8$ to $3\lambda/8$ from arbitrary integer times of the guided wavelength.

The waveguide may be formed by processing a thin film into the form of a stripe, and the gratings may be formed on a side plane of the stripe-shaped said thin film.

The optical functional device may function as a DFB laser or a DBR laser.

According to the invention, there is further provided an optical functional device manufacturing method comprising the steps of: forming a mask having a pattern of gratings on a waveguide material;

screening a part of the mask; processing the other part of the pattern not screened by the mask by anisotropic dry etching which can control asymmetry of gratings grooved into the waveguide material by controlling the incident direction; and screening the part of the mask heretofore not screened by the mask, and opening the part of the mask heretofore screened by the mask, and conducting anisotropic dry etching from an incident angle different from that of the former dry etching.

According to the invention, there is further provided an optical functional device manufacturing method comprising the steps of: forming a mask having first slopes and second slopes approximately symmetric with the first slopes on a waveguide material; and conducting etching having an anisotropy from a direction substantially parallel with the second slopes, asymmetric gratings being grooved into the waveguide material in accordance with the ratio in etching speed between a material forming the mask and the waveguide material.

According to the invention, there is further provided an optical communication system comprising an optical functional unit obtaining a light signal output and an optical fiber transmitting said light signal output by said optical functional unit, said optical functional unit including any of the optical functional devices summarized above.

The invention embodied and used in the above-summarized modes performs the following effects.

First of all, the invention realizes inexpensive, high-performance optical functional devices using higher-order gratings which are easy to process.

That is, by controlling the blaze angle or other structural factors of higher-order gratings and their phase shift, optical functional devices with higher accuracy and higher performance can be realized inexpensively. More specifically, it is realized by controlling the intensity profile in the longitudinal direction of the radiation mode. Its principle lies in that the structure of the present invention enables controlling the interaction of radiation mode and the guided mode along the waveguide differently.

Representative applications of the invention are DFB lasers and DBR lasers. These devices usually use fine 1st-gratings, and the use of higher-order gratings makes their fabrication easier. Additionally, increase of threshold currents by radiation modes is less. Further, difference in gain from the other longitudinal modes, which exhibits the single longitudinal mode performance, can be made larger than that of 1st-order gratings. In a particularly concrete structure of DFB laser, the phase shift is provided at the center of the waveguide, and asymmetric gratings with gentle inclinations facing to the phase shift are formed between phase shift. In this laser, a low threshold value and a good single mode selectivity can be obtained by sufficiently controlling radiation modes.

When gratings having asymmetric cross-sectional configuration inverted from the former asymmetric gratings are provided, the profile of a radiation mode as an output can be optimized also in a surface emitting laser.

Further, the invention ensures easy and reliable fabrication of asymmetric gratings.

Moreover, even when the gratings are grooved on a side plane of the waveguide stripe, various similar effects are obtained. Additionally, asymmetric gratings can be made very easily in this structure.

Furthermore, when those inexpensive, high-performance optical functional devices are used, optical communication systems are improved in cost and performance.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a cross-sectional view schematically showing a DFB laser as an optical functional device according to the first embodiment of the invention;

FIG. 2 is a diagram showing αL–δL relationship of DFB lasers according to the first embodiment;

FIG. 3 is a diagram showing αL–δL relationship of comparative examples using 2nd-order gratings with a symmetric cross-sectional configuration (Δ/Λ=0.5);

FIG. 4A and 4B are graphs showing intensity profiles in the cavity axial direction of a radiation mode emitted from gratings, that is, intensity profiles of 0-order mode, i.e., the radiation mode under the condition of Bragg diffraction, in which FIG. 4A shows that of 2nd-order asymmetric gratings and FIG. 4B shows that of 2nd-order symmetric gratings;

FIG. 5 is a diagram schematically showing a cross-sectional structure of a DFB laser according to the second embodiment of the invention;

FIG. 8 is a diagram showing a cross-sectional structure of an important part of a DFB laser according to the third embodiment of the invention;

FIG. 9 is a graph showing αL–δL characteristics of the structure according to the third embodiment;

FIGS. 13A through 13D are cross-sectional views for explaining important parts of a DFB laser manufacturing method according to the sixth embodiment of the invention;

FIG. 15 is a schematic cross-sectional view showing the angle of an etched plane;

FIGS. 16A through 16C are cross-sectional views for explaining important parts of the DFB laser manufacturing method according to the sixth embodiment;

FIG. 17 is a partly cut-off, perspective view for explaining important parts of a DFB laser according to the seventh embodiment;

FIG. 18 is a schematic diagram showing an optical communication system according to the eighth embodiment of the invention;

DETAILED DESCRIPTION OF THE PREFERRED EMBODIMENTS

Figure 6:
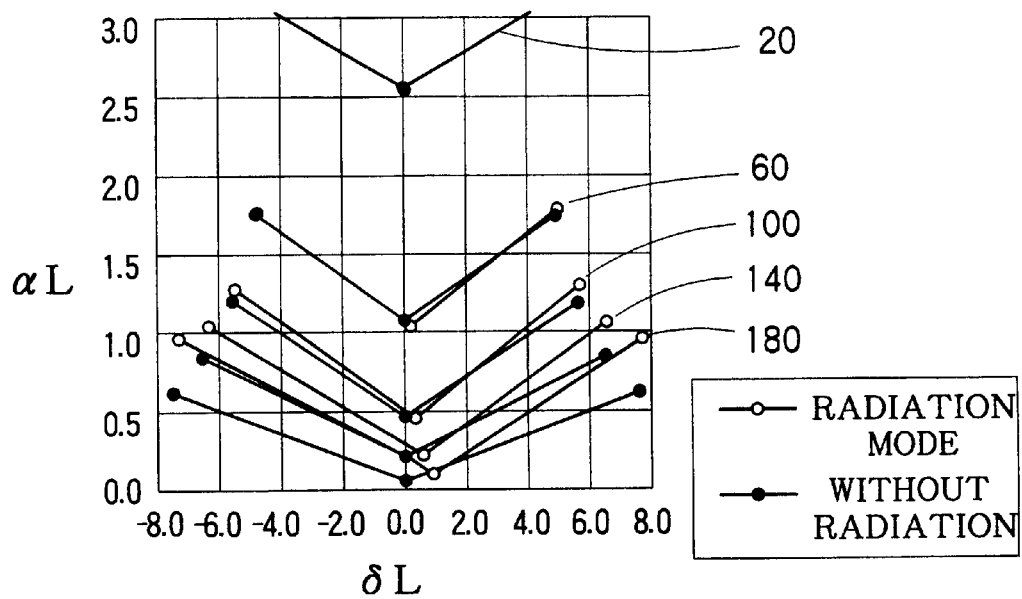
FIG. 6 is a graph showing αL–δL characteristics of the structure according to the second embodiment.

In waveguide structures having 2nd- or higher-order gratings, in general, part of guided light is escaped from the waveguide as radiation modes. In the present invention, gratings are asymmetrically configured in their cross section. And, by partly changing the asymmetry of the cross-sectional configuration of the gratings (for example, blaze angle) along the cavity lengthwise (longitudinal) direction, the profile of a radiation mode in the cavity lengthwise direction is controlled. Additionally, it is controlled by the relationship between a phase shift of the gratings and the asymmetry.

In edge emitting DFB lasers, radiation mode loss can be reduced to decrease the threshold current by utilizing canceling interaction. When a radiation mode is used as an output, the radiation mode can be intensified to increase the output by utilizing intensifying interaction.

Embodiments of the invention are explained below in detail with reference to the drawings.

FIG. 1 is a cross-sectional view schematically showing an optical functional device according to the first embodiment of the invention. That is, the optical functional device shown here is an InGaAsP/InP DFB laser. The structure of the laser according to this embodiment is explained below, following to its manufacturing procedures.

First made on an n-type InP substrate 1 is an n-type InP buffer layer 1' by crystal growth. Next grown thereon are an active layer 2 having a multi-stack structure consisting of InGaAsP quantum well layers and barrier layers, and a waveguide layer 3 having a lower refractive index than that of the active layer 2. The active layer 2 is designed to have the gain spectral peak of 1550 nm. The waveguide layer 3 is 300 nm thick, and its composition is determined to have a band gap corresponding to the wavelength of 1350 nm. After these steps of growth, the wafer is taken out from the growth furnace. Then, 2nd-order gratings 11 are grooved on the waveguide layer 3. The gratings 11 have an asymmetric cross section of a blaze angle satisfying $\Delta/\Lambda=0.25$ as shown in the drawing. Where $\Lambda$ is the period of the gratings, i.e., the length of the unit structure. When $\Delta/\Lambda=0.5$, gratings are symmetric. For the target oscillation wavelength of 1550 nm, the grating period $\Lambda$ is designed to be 480 nm. This is twice the period of 1st-order gratings. In this case, the optimum depth of the 2nd-order gratings 11 becomes as deep as approximately 120 nm.

Simultaneously, a discontinuity of the gratings 11, i.e., a phase shift 15, amounted to be ¼ of the guided wavelength $\lambda$, is made at the center of the cavity. The same effect is also obtained by using a structure changing the effective refractive index of the waveguide instead of the phase shift. That is, even when the period of the gratings 11 is uniform, an effective phase shift region (not shown) where the waveguide structure changes in width, thickness or refractive index functions to shift the phase. The phase shift 15 preferably has an offset amount not smaller than $\lambda/8$ and not larger than $3\lambda/8$ from arbitrary integer times of the guided wavelength $\lambda$. The above-mentioned $\lambda/4$ corresponds to the optimum value in this range.

After that, while keeping the configuration of the gratings 11 and the phase shift 15, a p-type InP layer 4 and a p-type InGaAs contact layer 5 are stacked on them by crystal growth.

On both edges, AR (anti-reflection) films 50 is coated. FIG. 2 is a $\alpha L$–$\delta L$ diagram of the DFB laser. $\alpha L$ on the vertical axis is the product of a threshold gain a and the cavity length L. The smaller it is, the lower the threshold currents. The horizontal axis represents $\delta L$, and $\delta$ is a deviation of the phase constant of a vertical mode from the Bragg condition. That is, $\delta=0$ corresponds to the Bragg condition. In detail, $\delta$ is defined by the following equation.

$$\delta=\beta_1-\beta_0=2\pi n_{eff}(1/\lambda_1-1/\lambda_0) \quad (1)$$

where $\beta_0$ is the phase constant at the Bragg wavelength, and $\beta_1$ is the phase constant of longitudinal mode deviated from the Bragg diffraction condition. $n_{eff}$ is the effective refractive index, $\lambda_1$, is the wavelength of the longitudinal corresponding to $\beta_1$, and $\lambda_0$ is the Bragg wavelength.

The term in the parenthesis on the right side of Equation (1) can be approximated as:

$$(1/\lambda_1-1/\lambda_0)\cong(\lambda_0-\lambda_1)\lambda_0^2 \quad (2)$$

Therefore, it is known from Equation (1) that $\delta$ is the quantity corresponding to the wavelength deviation of the longitudinal mode. More specifically, by changing the sign of the horizontal axis to the contrary and multiplying it by $2\pi n_{eff}/\lambda_0^2$, the product corresponds to the wavelength deviation of the longitudinal mode from the Bragg wavelength.

FIG. 2 shows graphs of lasers with the cross-sectional configuration of the gratings 11 asymmetrically triangular to satisfy $\Delta/\Lambda=0.265$ as a parameter of the depth of the gratings from 20 nm to 180 nm every 40 nm. For each depth of the gratings, open circles indicating are connected by solid lines as a group. That is, three modes constellation connected by solid lines correspond to the gratings of depths in intervals of 40 nm from 20 nm to 180 nm, respectively, in the order from one having the highest threshold value.

In any of the diagrams showing the relationship among these three longitudinal modes, the threshold value $\alpha L$ is minimized under the condition near $\delta=0$. That is, the lasers oscillate most in the longitudinal mode near the Bragg wavelength, resulting in good mode selectivity.

Closed circles in FIG. 2 are $\alpha L$–$\delta L$ diagrams of conventional lasers having 1st-order symmetric gratings with the same value of κ for comparison.

FIG. 3 shows $\alpha L$–$\delta L$ diagrams of comparative examples using 2nd-order gratings with a symmetric cross-section ($\Delta/\Lambda=0.67$). That is, here again, for each depth of the gratings, open circles indicating are connected by solid lines. That is, three modes connected by solid lines correspond to the gratings of depths at the intervals of 40 nm from 80 nm to 240 nm, respectively, in the order from one having the highest threshold. That is, in order to obtain the same κ as those having asymmetric gratings, the symmetric gratings must be deeper. Closed circles in FIG. 3 are $\alpha L$–$\delta L$ diagrams of conventional lasers having 1st-order symmetric gratings with the same value of κ for comparison.

In review of FIG. 3, in the comparative examples having 2nd-order symmetric gratings shown by open circles, as the gratings becomes deeper, $\alpha L$ apparently becomes much larger than the case of 1st-order gratings having the same κ. More specifically, $\alpha L$ of the longitudinal mode on the right side in the drawing increases, and $\alpha L$ of the Bragg mode ($\delta=0$) is affected thereby and also increases. That is, threshold of these modes increase. In the comparative example with the depth of 240 nm, $\alpha L$ at the Bragg mode and the $\alpha L$ of the submode mode on the left side become almost equal. That is, threshold of these modes become almost equal, resulting in deteriorating single longitudinal mode capability.

In contrast, in case of the 2nd-order asymmetric gratings shown in FIG. 2, the threshold of the mode on the right side does not increase so much, and the single mode capability is maintained. Moreover, the change of $\alpha L$ by the use of 2nd-order asymmetric gratings is kept small. That is, using 2nd-order gratings easier to process, both low threshold operation and a sufficient longitudinal mode capability can be realized. Additionally, since a larger κ is obtained with shallower gratings, it is excellent in efficiency as well.

Operation of the invention is explained below with reference to FIGS. 4A and 4B. FIG. 4A and 4B are intensity profiles in the cavity axial direction of a radiation mode for 0-th mode, i.e., the radiation mode near the Bragg mode. FIG. 4A shows the profile of radiation mode from 2nd-order asymmetric gratings and FIG. 4B shows the profile of radiation mode from 2nd-order symmetric gratings.

As shown in FIG. 4B, in case of symmetric gratings, the symmetric gratings exhibit profiles having sharp-point peaks at the $\lambda/4$ phase shift at the cavity center, and a considerable amount of power in coupled into radiation modes. That is, the loss by radiation modes is large, and the threshold of the Bragg mode increases. In contrast, as shown in FIG. 4A, radiation modes from 2nd-order gratings having the asymmetric cross-sectional configuration are divided to parts with intensive radiation modes (on the left side in the drawing) and parts with weak radiation modes (on the right side in the drawing) at the λ/4 phase shift at the cavity center. This depends on whether two radiation modes generated respectively from the two guided modes travelling to the left and the right constructively interfere or destructively interfere in the gratings. In case of asymmetric gratings, the power of the guided modes is less liable to be converted into radiation modes than in symmetric gratings, and the threshold is kept small as illustrated. Additionally, as a result of more detailed researches by the Inventor, it has been noted, although not shown, that, in case of asymmetric gratings, the loss by radiation modes increases in the sub-modes apart from the Bragg modes as shown by open circles in the left and the right, respectively, in FIG. 2. That is, in case of asymmetric gratings, the threshold of the 0-th mode is low, and a gain difference is obtained as well between modes at both sides, which facilitates oscillation in a single longitudinal mode.

As explained above in detail, the embodiment shown here is advantageous in that, by combining a high-order grating period, asymmetric cross-sectional configuration and phase shift, a property similar to that of excessively fine 1st-order gratings. That is, it has the advantage that a DFB laser having a low threshold value and a single mode capability equivalent to those of conventional 1st-order gratings can be manufactured much easier than conventional lasers using 1st-order gratings. Moreover, since κ values equivalent to those of deep gratings can be realized with shallower gratings, it is efficient.

Next explained is the second embodiment of the invention.

FIG. 5 is a diagram schematically showing a cross-sectional structure of a DFB laser according to the second embodiment. Regarding this embodiment, components equivalent to those of the foregoing first embodiment are marked common reference numerals in FIG. 5, and their detailed explanation is omitted. In the laser shown in FIG. 5, the asymmetric cross-sectional configuration of the gratings 11 is symmetric between the left part and the right part with respect to the λ/4 phase shift 15 at the cavity center. That is, the blaze angle of the gratings 11 is different between the left part and the right part separated at the phase shift 15, and the blaze angle of the left part and that of the right part are symmetric with each other. In the example of FIG. 5, slopes of the grating facing to the phase shift 15 are gentler.

FIG. 5, let the period of the gratings 11 be Λ, and the right side slope portion be A. Then, the cross-sectional configuration of the gratings in the laser structure shown in FIG. 5 corresponds to an asymmetric triangle of Δ/Λ=0.75 on the left side of the λ/4 phase shift 15 and an asymmetric triangle of Δ/Λ=0.25 on the right side thereof.

FIG. 6 is a diagram showing αL–δL relationship of the structure according to the second embodiment. That is, similarly to the former example, open circles are values obtained by changing the depth of the gratings from 20 nm to 180 nm at the intervals of 40 nm. Closed circles represent αL–δL characteristics of conventional 1st-order symmetric gratings having the same κ value.

In the DFB laser shown here, the threshold gain αL can be reduced smaller than the first embodiment explained before, notwithstanding the use of 2nd-order gratings. That is, as shown in FIG. 6, αL of the laser according to this embodiment is not substantially different from that of 1st-order gratings. Additionally, αL values of two longitudinal modes existing on the left side and the right side of the 9-th mode in FIG. 6 are relatively large, and a larger threshold gain difference can be obtained. This is because the radiation mode loss increases, in contrast, in these sub-modes. Also in this embodiment, the phase shift 15 preferably has an offset amount of phase within the range from λ/8 to 3λ/8 from arbitrary integer times of the guided wavelength λ. λ/4 mentioned above corresponds to the optimum value.

Figure 7:
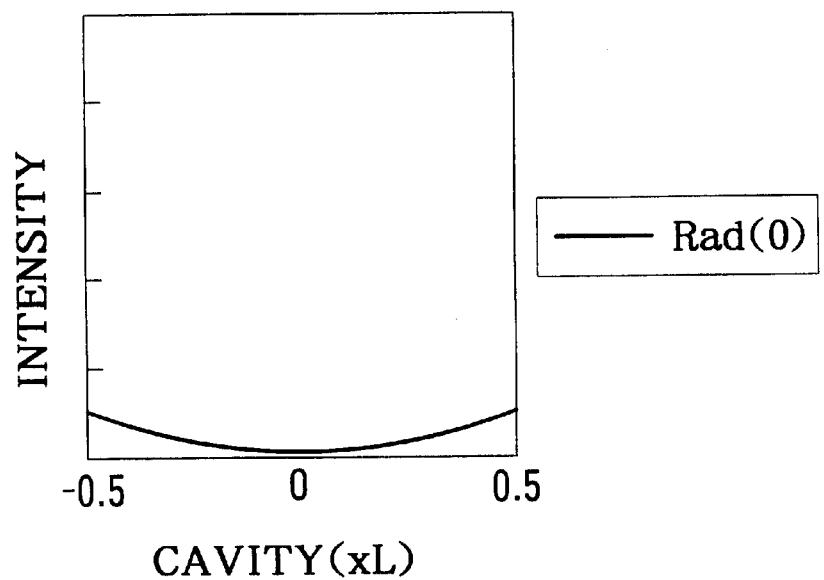
FIG. 7 is a graph showing the intensity profile of a radiation mode in the cavity axial direction in the structure according to the second embodiment.

FIG. 7 shows the intensity profile of radiation modes in the axial direction in the structure according to the second embodiment. That is, FIG. 7 shows radiation modes for the mode nearest the 0-th mode, i.e., the Bragg mode condition. It is known from FIG. 7 that the radiation mode of the 0-th mode is very low in this embodiment. This is because almost all of radiation modes does not escape from the waveguide due to their destructive interference in the gratings.

As explained above, according to the second embodiment, more excellent single mode capability than in 1st-order gratings can be obtained, and its threshold is kept small as well as decreased equivalently. Furthermore, its fabrication is easier than the fine 1st-order gratings.

Next explained is the third embodiment of the invention.

FIG. 8 is a diagram schematically showing a cross-sectional structure of a major part of a DFB laser according to the third embodiment.

Here again, components equivalent to those of the first embodiment are labeled common reference numerals in FIG. 8, and their detailed explanation is omitted. Also in the laser shown here, the asymmetric cross-sectional configuration of the gratings 11 is symmetric between the left part and the right part with respect to the λ/4 phase shift 15 at the cavity center. In this embodiment, however, slopes of the grating facing to the phase shift 15 are steeper. That is, the cross-sectional configuration of the gratings 11 in the laser structure shown in FIG. 5 corresponds to an asymmetric triangle of Δ/Λ=0.25 on the left side of the λ/4 phase shift 15 and an asymmetric triangle of Δ/Λ=0.75 on the right side thereof.

FIG. 9 is a diagram showing αL–δL relationship the structure according to the third embodiment. That is, similarly to the former example, open circles are values obtained by changing the depth of the gratings from 20 nm to 180 nm in intervals of 40 nm. Closed circles represent αL–δL characteristics of conventional 1st-order symmetric gratings having the same value of κ.

Figure 10:
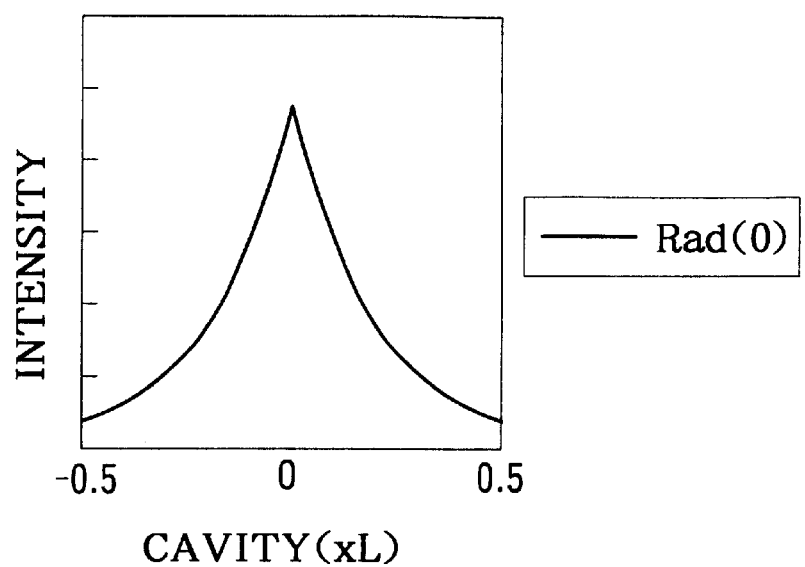
FIG. 10 is a graph showing the intensity profile of a radiation mode in the cavity axial direction in the structure according to the third embodiment.

FIG. 10 shows the intensity profile of radiation modes in the cavity axial direction in the structure according to the third embodiment. That is, FIG. 10 shows radiation modes for the 0-th mode, i.e., the mode nearest the Bragg condition. As noted from FIG. 10, radiation modes are very strong in the laser according to this embodiment. This is because constructive interference occurs within the gratings. That is, in this embodiment, radiation modes are too large, and if the depth of the gratings increased, the radiation loss increases so much. More specifically, as shown by open circles in the αL–δL graphs of FIG. 9, as the depth of the gratings increases, αL of the 0-th mode decreases until the depth is 180 nm, then αL turns to increase. This means that the threshold increases. Simultaneously, the difference in αL from sub-modes is also reduced very small. Therefore, its single longitudinal mode performance is not so good.

This embodiment, however, can positively use the intensive radiation modes, to the contrary from the foregoing embodiment. For example, by employing this embodiment in a surface emitting light emitting device such as grating-coupled surface emitting laser (GCSEL) using a radiation mode as its output, the optical output can be increased.

Therefore, by appropriately adjusting the κ value, a high-output surface emitting laser can be realized.

Also in this embodiment, the phase shift 15 preferably has an offset amount of phase within the range from $\lambda/8$ to $\lambda 3/8$ from arbitrary integer times of the guided wavelength $\lambda$. $\lambda/4$ mentioned above corresponds to the optimum value.

Next explained is the fourth embodiment of the invention.

Figure 11:
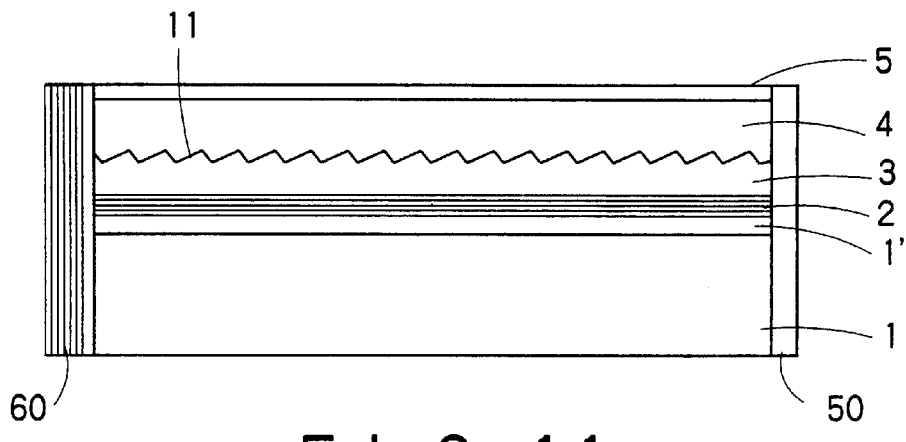
FIG. 11 is a diagram showing a cross-sectional structure of an important part of a DFB laser according to the fourth embodiment of the invention.

FIG. 11 is a diagram schematically showing a cross-sectional structure of a major part of a DFB laser according to the fourth embodiment. Here again, components equivalent to those of the first embodiment are labeled common reference numerals in FIG. 11, and their detailed explanation is omitted. The laser shown here is intended to perform the same function as FIG. 5 by employing a HR-AR (high reflectivity-anti-reflection) structure. That is, when a mirror image is imagined by turning back the structure shown in FIG. 11 at the position of HR 60, a structure equivalent to the laser of FIG. 5 is obtained. In this case, the facet with HR 60 functions as a phase shift. For this purpose, reflectivity of the facet phase at HR 60 and its relative phase are important. In other words, by optimizing them, highly efficient finction of $\lambda/4$ phase shift can be obtained. Also in this embodiment, the facet at HR 60 preferably has an offset amount of phase equivalent to the central phase shift structure as in the range from $\lambda/8$ to $\lambda 3/8$ from arbitrary integer times of the guided wavelength $\lambda$. ¼ mentioned above corresponds to the optimum value.

According to the fourth embodiment, the same various effects as those of the second embodiment can be obtained using a simple structure. That is, more excellent single mode capability than 1st-order gratings can be obtained, and its threshold can be also kept small as well. Furthermore, its fabrication is easier than fine 1st-order gratings.

Furthermore, the fourth embodiment is configured as if the waveguide is folded back about the phase shift. Therefore, let the size of the device be constant, the cavity length L can be considered effectively longer by the turning-back amount, and the coupling coefficient κ may be smaller. That is, the gratings may be shallower. For grooving shallower gratings, the waveguide layer may be thinner so much. Therefore, the embodiment is effective in improving the margin for the design of the waveguide. In the present invention, even when the gratings are shallower, their optimum depth is not less than 60 nm. Therefore, its fabrication is still much easier than the case using 1st-order gratings (20 nm to 30 nm).

Next explained is the fifth embodiment of the invention.

Figure 12:
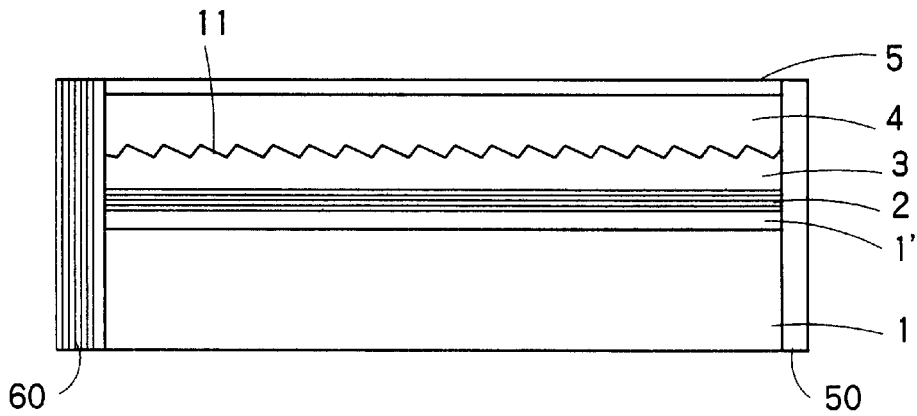
FIG. 12 is a diagram showing a cross-sectional structure of an important part of a DFB laser according to the fifth embodiment of the invention.

FIG. 12 is a diagram schematically showing a cross-sectional structure of a major part of a DFB laser according to the fifth embodiment. Here again, components equivalent to those of the first embodiment are labeled common reference numerals in FIG. 12, and their detailed explanation is omitted. The laser shown here is intended to perform the same function as FIG. 8 by employing a HR-AR (high reflectivity-anti-reflection) structure. That is, when a mirror image is imagined by turning back the structure shown in FIG. 12 at the position of HR 60, a structure equivalent to the laser of FIG. 8 is obtained. In this case, the facet with HR 60 functions as a phase shift. Here again, reflectivity of the facet phase at HR 60 and its relative phase are important. In other words, by optimizing them, highly efficient function of $\lambda/4$ phase shift can be obtained. Also in this embodiment, the facet at HR 60 preferably has an offset amount of phase equivalent to the central phase shift structure as in the range from $\lambda/8$ to $\lambda 3/8$ from arbitrary integer times of the guided wavelength $\lambda$. $\lambda/4$ mentioned above corresponds to the optimum value.

According to the invention, it is possible to intensify radiation modes, using a simple structure, and the same various effects as those of the third embodiment can be obtained. That is, a high-output surface emitting device like GCSEL can be realized.

Furthermore, the fourth embodiment is also configured as if the waveguide is folded back at the phase shift. Therefore, let the size of the device be constant, the cavity length L can be considered effectively longer by the turning-back amount, and the coupling coefficient κ may be smaller. That is, the gratings may be shallower. For grooving shallower gratings, the waveguide layer may be thinner so much. Therefore, the embodiment is effective in improving the margin for the design of the waveguide. In the present invention, even when the gratings are shallower, their optimum depth is not less than 60 nm as set forth above. Therefore, its fabrication is still much easier than the case using 1st-order gratings (20 nm to 30 nm).

Next explained is the sixth embodiment of the invention.

FIGS. 13A through 13D are cross-sectional views roughly showing a major part of a DFB laser manufacturing method according to the sixth embodiment. That is, these figures show a method for manufacturing the gratings according to the second or third embodiment explained before.

In general, processing for inverting the blaze angle of gratings between its left and right sides about the phase shift is considerably difficult. When wet etching is used, the (111) A plane undesirably appears, and symmetric gratings are formed. Although asymmetric gratings ca be made by using a substrate having an off-angle from the (100) plane, the blaze angle cannot be inverted about the phase shift.

In order to realize it, dry etching less dependent on the surface orientation is used. Ion milling and reactive ion etching (RIE) are examples of dry etching of this type.

First as shown in FIG. 13A, a mask 16 corresponding to the period of the gratings is formed on the surface of the semiconductor layer for grooving the gratings. Appropriate one of various materials such as resist and silicon oxide film can be used as the material of the mask 16.

Next as shown in FIG. 13B, by introducing an etching gas or mechanically scraping ion beams aslant of the substrate surface, the blaze angles are made. In this case, one side of the phase shift 15 is protected by an appropriate mask, and the blaze gratings are made only on the other side. In this etching, the underlying layer of the mask 16 is preferably removed slightly as well by appropriately inducing the isotropic etching mode by utilizing such as "intrusion" of the etching gas. By etching the underlying layer of the mask 16 as well, gratings with the asymmetric triangular cross-sectional configuration can be obtained.

Next as shown in FIG. 13C, the gratings once made are covered by a metal mask, and gratings of a different blaze angle are formed with a different incident angle.

Finally, as shown in FIG. 13D, by removing the mask 16, the intended gratings are completed. FIGS. 13 A through 13D merely show a part of the laser for grooving the gratings 11, and omit the other part from illustration.

Next explained is a first modification of this embodiment.

FIGS. 14A through 14D are cross-sectional views roughly showing a major part of a DFB laser manufacturing method according to the sixth embodiment. That is, these figures show a method for manufacturing the asymmetric gratings.

Figure 14A:
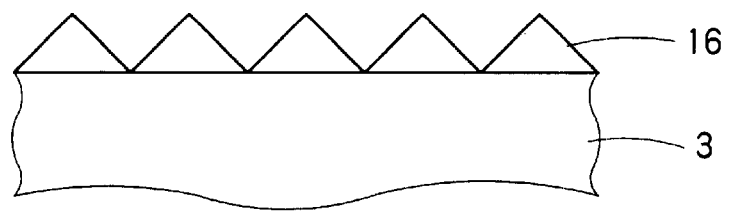
FIGS. 14A through 14D are cross-sectional views for explaining important parts of the DFB laser manufacturing method according to the sixth embodiment of the invention.

In this modification, first as shown in FIG. 14A, a mask 16 having a symmetric cross-sectional configuration is made on the semiconductor layer 3. The cross-sectional configuration is preferably triangular, but need not be a strict triangular configuration.

Figure 14B:
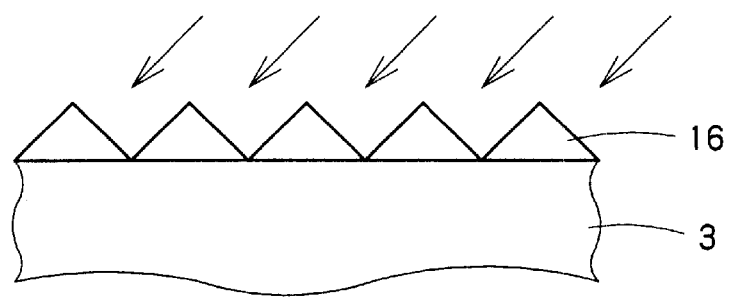

Next as shown in FIG. 14B, anisotropic etching is conducted diagonally from above the mask 16. In this case, the incident angle of etching beams is preferably approximately parallel to the slopes of the mask.

Figure 14C:
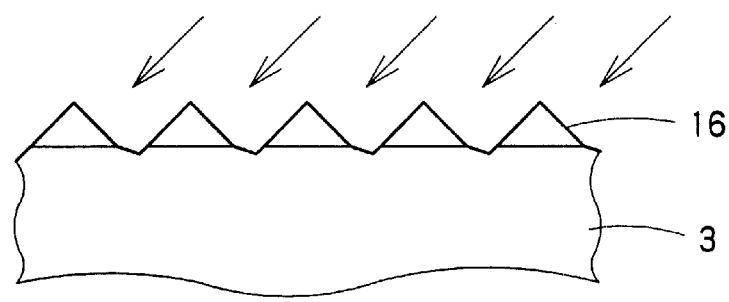
Figure 14D:
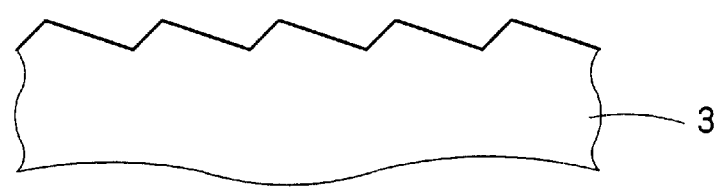
Figure 19:
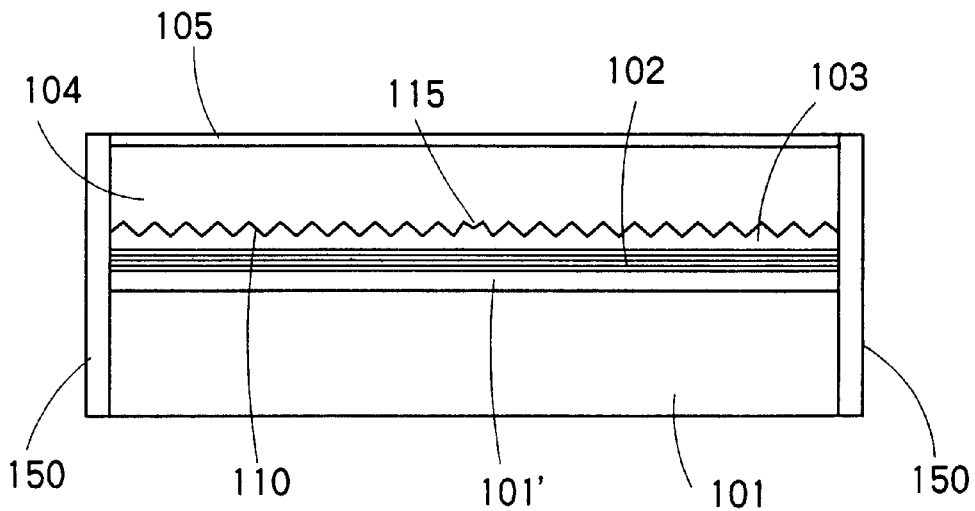
FIG. 19 is a longitudinal cross-sectional view showing a structure of a conventional InGaAsP/InP-DFB laser.
Figure 20:
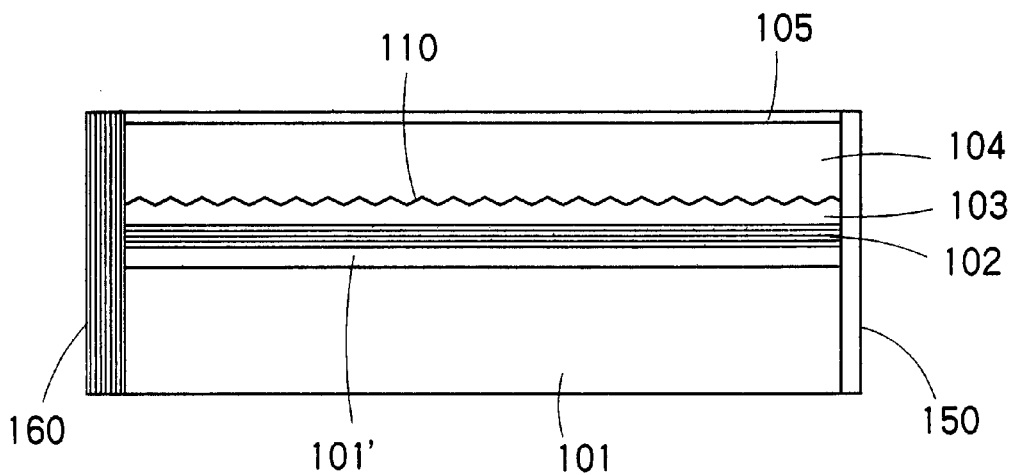
FIG. 20 is a cross-sectional view of a laser having a HR-AR (high reflectivity-anti-reflection) structure.

Next as shown in FIG. 14C, one kind of slopes of the mask 16 is etched. Then, from the thinnest portions at the foots of the slopes of the mask 16, the underlying semiconductor layer 3 is gradually exposed, and etching of the semiconductor layer 3 progresses. Thus, depending on the relation of the etching speed between the mask 16 and the semiconductor layer 3, the angle of the etched planes varies.

FIG. 15 is a cross-sectional view roughly showing the angle of a etched plane.

That is, broken lines A and A denote etching planes in the case where the mask 16 and the semiconductor layer 3 are equal in etching speed. When etching progresses as it is, symmetric gratings connecting broken lines O–A'–O are grooved. That is, in this case, the configuration of the mask 16 is directly copied to the semiconductor layer 3, and the angles of the etched planes are equal to those of slopes of the mask 16.

On the other hand, broken lines B–B' represent etching planes in the case where the etching speed of the semiconductor layer is slower than that of the mask. In this case, etched planes of the semiconductor layer inclines gentler than the slope of the mask.

When etching progresses as it is, asymmetric gratings connecting the broken lines O–B'–O are grooved.

Broken lines C and C' represent etching planes in the case where the etching speed of the semiconductor layer is faster than that of the mask. In this case, etches planes of the semiconductor layer become steeper slopes than the slopes of the mask. When etching progresses as it is, asymmetric gratings connecting broken lines O–C'–O are grooved.

As explained above, according this modification, by executing anisotropic etching from a slanted direction to the mask having a symmetric cross-sectional configuration, asymmetric gratings can be grooved. The blaze angle of the gratings made here can be controlled by selecting an appropriate material of the mask and adjusting the ratio of its etching speeds relative to that of the semiconductor layer.

Next explained is a second modification of the sixth embodiment.

FIGS. 16A through 16C are cross-sectional views roughly showing a major part of a DFB laser manufacturing method according to the sixth embodiment. That is, these figures show a method for manufacturing the asymmetric gratings.

In this modification, first as shown in FIG. 16A, a mask 16 having an asymmetric cross-sectional configuration is made on the semiconductor layer 3. The cross-sectional configuration is preferably triangular, but need not be a strict triangular configuration.

Next as shown in FIG. 16B, anisotropic etching is conducted from above the mask 16. In this case, the incident angle of etching beams may be approximately perpendicular to the major surface of the semiconductor layer. Then, the mask 16 is etched, and the underlying semiconductor layer gradually exposed and etched from thin portions of the mask 16.

At the time when the mask 16 is completed etched, the asymmetric configuration of the mask 16 is transferred to the semiconductor layer 3, and asymmetric gratings 11 can be made as shown in FIG. 16C. When the mask and the semiconductor layer are different in etching speed, the angle of sloped of the mask and the angle of slopes of the semiconductor layer become different while maintaining the asymmetry. Therefore, anisotropic gratings of a predetermined depth can be grooved by selecting an appropriate mask material and adjusting the ratio of its etching speed relative to that of the semiconductor layer.

Next explained is the seventh embodiment of the invention.

FIG. 17 is a partly cut-off, perspective view schematically illustrating a DFB laser according to the seventh embodiment. The laser shown here has a so-called buried structure (BH: buried heterostructure). That is, an active layer 2 of a multiple-quantum well (MQW) structure is formed in shape of a stripe on an n-type InP substrate 1. The active layer 2 has gratings 12 on its side planes, and buried with p-type InP 4. The gratings has a 2nd- or higher-order asymmetric configuration, and may include a phase shift, not shown. That is, the same gratings as any one of the first to fifth embodiments can be grooved.

An n-type InP layer 70 is a current blocking layer for constricting current into the active layer 2. The n-type InP layer 70 has an opening above the active layer 2, and functions to block current by a reverse bias junction in the remainder region. Further formed on p-type InP 4 is an InGaAsP contact layer 5, and the p-side electrode 21 and the n-side electrode 20 are formed on the top and the bottom of the device.

Also when the gratings 12 are grooved on a side plane of the 30 stripe-shaped active layer 2, the same effects as those of the first to fifth embodiments are obtained. Additionally in this embodiment, since the gratings are grooved on the side planes of the waveguide structure, any desired shape of diffraction gratings can be realized by one-shot mask alignment. That is, since the gratings can be grooved simultaneously with the patterning for forming the waveguide active layer 2 to be buried, manufacturing procedures therefor can be omitted. Additionally since their configuration can be controlled by the mask, any asymmetric structure can be readily obtained by using an appropriate mask pattern.

Next explained is the eighth embodiment of the invention.

FIG. 18 is a diagram schematically showing an optical communication system according to the eighth embodiment. The system shown here has optical functional units 700 including any of optical functional devices according to the embodiments explained above, and optical signals are transmitted by optical fibers 800. Furthermore, electronic circuits 900 for processing received signals are provided around the optical functional units 700.

DFB lasers according to the invention are inexpensive and excellent in single longitudinal mode property and low-threshold oscillating property. Therefore, optical communication devices incorporating them are inexpensive and excellent in property as well, and hence have a great advantage. That is, the invention enables installing large-capacity optical transmission systems at a low cost, and can greatly enrich infrastructures of information communication systems.

Some embodiments of the invention have been explained above with reference to specific examples. The invention, however, it is not limited to these examples. For instance, these specific examples have been explained, talking DFB lasers, the invention can be similarly applied to distributed Bragg reflector (DBR) lasers, for example, and ensures substantially the same effects.

Additionally, the invention is widely applicable to all optical functional devices having a waveguide and gratings extending in its lengthwise direction.

As to asymmetric configurations, various modes are usable other than those used in the specific examples, and those skilled in the art may choose any appropriate one therefrom. For example, asymmetry of the blaze angles may be changed gradually along the waveguide. Alternatively, three of more regions different in asymmetry may be provided along the waveguide.

Moreover, there are an uncountable number of combinations of the number, position and quantity of the phase shift. Various asymmetry and combinations can be made in accordance with applications, and those skilled in the art can choose any one of them. That is, enormous applications are possible, not departing from the concept of the invention, namely, optimizing properties by appropriate combinations of asymmetry with its distribution, phase shift and/or facet phase.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No.H10-220373 filed on Aug. 4, 1998 including specification, claims, drawings and summary is incorporated herein by reference in its entirety.

What is claimed is:

1. An optical functional device for emitting light of a specific wavelength spectrum comprising a waveguide and gratings formed along said waveguide, said gratings causing 2nd- or higher-order Bragg diffraction of light with said specific wavelength spectrum, and said gratings having a unit structure which is asymmetric in a longitudinal direction of said waveguide.

2. The optical functional device according to claim 1 wherein said gratings have at least a phase shift discontinuous in phase.

3. The optical functional device according to claim 1 wherein said gratings varying in degree of said asymmetry along a longitudinal direction of said waveguide.

4. The optical functional device according to claim 1 wherein said gratings have a first part including unit structures each having a first asymmetry, and a second part including unit structures each having a second asymmetry different from that of said first part.

5. The optical functional device according to claim 4 wherein said gratings have said first part on the side of one end of said waveguide and said second part on the side of the other end of said waveguide, said gratings having a phase shift discontinuous in phase between said first part and said second part.

6. The optical functional device according to claim 5 wherein said first part and said second part are so configured that radiation modes escaped from said waveguide through said gratings attenuate interactively by interference therebetween.

7. The optical functional device according to claim 6 wherein said gratings includes a plurality of protrusions periodically aligned along a longitudinal axis of said waveguide and each forming each said unit structure, each said protrusion defining a slope facing to said phase shift which is gentler than a slope on the far side of said phase shift, said phase shift being discontinuous in phase by $\{n\lambda \pm (1/8 \sim 3/8)\}\lambda$ where $\lambda$ is the guided wavelength, and n is arbitrary integer.

8. The optical functional device according to claim 5 wherein said first part and said second part are so configured that radiation modes escaped from said waveguide through said gratings intensify interactively by interference therebetween.

9. The optical functional device according to claim 8 wherein said gratings includes a plurality of protrusions periodically aligned along a longitudinal axis of said waveguide and each forming each said unit structure, each said protrusion defining a slope facing to said phase shift which is steeper than a slope on the far side of said phase shift, said phase shift being discontinuous in phase by $\{n\lambda \pm (1/8 \sim 3/8)\}\lambda$ where $\lambda$ is the guided wavelength, and n is arbitrary integer.

10. The optical functional device according to claim 1 wherein said gratings have a high-reflectivity facet having a high optical reflectivity at one end thereof, and a low-reflectivity facet having a low optical reflectivity at the other end thereof.

11. The optical functional device according to claim 10 wherein said gratings are so configured that radiation modes escaped from said waveguide therethrough attenuate interactively by interference depending on the relative phase at said high-reflectivity facet.

12. The optical functional device according to claim 11 wherein said gratings includes a plurality of protrusions periodically aligned along a longitudinal axis of said waveguide and each forming each said unit structure, each said protrusion defining a slope facing to said high-reflectivity facet which is gentler than a slope thereof facing to said low-reflectivity facet, said relative phase at said high-reflectivity facet being $n\lambda + 3\lambda/4 - \lambda/4 \sim +\lambda/4$ where $\lambda$ is the guided wavelength, and n is arbitrary integer.

13. The optical functional device according to claim 10 wherein said gratings are so configured that radiation modes escaped from said waveguide therethrough intensify interactively by interference depending on the relative phase at said high-reflectivity facet.

14. The optical functional device according to claim 13 wherein said gratings includes a plurality of protrusions periodically aligned along a longitudinal axis of said waveguide and each forming each said unit structure, each said protrusion defining a slope facing to said high-reflectivity facet which is steeper than a slope thereof facing to said low-reflectivity facet, said relative phase at said high-reflectivity facet being $n\lambda + 3\lambda/4 - \lambda/4 \sim +\lambda/4$ where $\lambda$ is the guided wavelength, and n is arbitrary integer.

15. The optical functional device according to claim 1 wherein said waveguide is formed by processing a thin film into the form of a stripe, said gratings being formed on a side plane of the stripe-shaped said thin film.

16. The optical functional device according to claim 1 wherein said optical functional device functions as a DFB laser or a DBR laser.

17. An optical communication system comprising:

an optical functional unit outputting a light signal; and an optical fiber transmitting said light signal output by said optical functional unit, said optical functional unit including a optical functional device, said optical functional device emitting light of a specific wavelength spectrum having a waveguide and gratings formed along said waveguide, said gratings causing 2nd- or higher-order Bragg diffraction of light with said specific wavelength spectrum, and said gratings having a unit structure which is asymmetric in a longitudinal direction of said waveguide.

18. The optical communication system according to claim 17 wherein said gratings have a phase shift discontinuous in phase.

* * * * *